US006710646B1

(12) United States Patent
Kimball

(10) Patent No.: US 6,710,646 B1
(45) Date of Patent: Mar. 23, 2004

(54) CUK STYLE INVERTER WITH HYSTERETIC CONTROL

(75) Inventor: Donald Felt Kimball, San Diego, CA (US)

(73) Assignee: Telefonaktiebolaget LM Ericsson (SE)

( * ) Notice: Subject to any disclaimer, the term of this patent is extended or adjusted under 35 U.S.C. 154(b) by 0 days.

(21) Appl. No.: 10/404,388

(22) Filed: Apr. 1, 2003

Related U.S. Application Data

(63) Continuation-in-part of application No. 09/911,105, filed on Jul. 23, 2001, now Pat. No. 6,583,664, which is a continuation-in-part of application No. 09/566,194, filed on Sep. 5, 2000, now Pat. No. 6,300,826.

(51) Int. Cl.$^7$ ................................................. H03F 3/38
(52) U.S. Cl. ......................... 330/10; 330/330; 330/251; 330/238
(58) Field of Search ...................... 330/10, 251, 238, 330/207 A, 59; 375/238

(56) References Cited

U.S. PATENT DOCUMENTS

| 4,184,197 | A | 1/1980 | Cuk et al. |
| 4,346,349 | A | 8/1982 | Yokoyama |
| 5,170,132 | A | 12/1992 | Lucas et al. |
| 5,905,407 | A | 5/1999 | Midya |
| 6,188,276 | B1 * | 2/2001 | Simpopoulos |

FOREIGN PATENT DOCUMENTS

| JP | 60223212 | * 11/1985 |
| WO | WO99/18663 | 4/1999 |

OTHER PUBLICATIONS

Zane et al. "Nonlinear—carrier control for high–power–factor rectifiers based on flyback, Cuk or Sepi. converters" Applied Power Electronics Conferences and Expo 1996 11$^{th}$ Annual event, vol. 2, 3–7 pp. 814–820.*

* cited by examiner

Primary Examiner—Michael B Shingleton
(74) Attorney, Agent, or Firm—Coats & Bennett, P.L.L.C.

(57) ABSTRACT

A dc voltage converter or dc-RF modulation converter includes an inverting Ćuk converter circuit operating under hysteretic feedback control. In an exemplary embodiment, the converter further includes a damping circuit to ensure stability over the extended control frequency bandwidth afforded by the hysteretic control. The converter may further include a non pulse-skipping pulse width control circuit, such that the hysteretic controller's switching signal is limited to maximum and minimum pulse widths, which avoids potential saturation issues where transformer isolation is used for switching the Ćuk circuit. In an exemplary application, the converter is used as part of a supply modulation amplifier circuit within a wireless base station, which application capitalizes on the extended bandwidth gained through hysteretic control and reduced circuit complexity by generating signal amplification power directly from the −48 VDC supply rail in the base station.

17 Claims, 6 Drawing Sheets

CUK STYLE INVERTER WITH HYSTERETIC CONTROL

RELATED APPLICATIONS

This application is C-I-P of U.S. application Ser. No. 09/911,105, filed on Jul. 23, 2001 now U.S. Pat. No. 6,583,664 and a C-I-P of and from U.S. application Ser. No. 09/566,194, filed on May 5, 2000, now issued as U.S. Pat. No. 6,300,826. Both the issued U.S. patent and the co-pending application are expressly incorporated herein by reference.

BACKGROUND OF THE INVENTION

The present invention generally relates to dc voltage converters and particularly relates to an inverting converter operating under hysteretic feedback control, such as used for dc-to-dc conversion or dc-to-RF modulation.

Switch-mode dc-to-dc converters offer potentially significant efficiency gains as compared to their linear converter counterparts, particularly for applications involving high load currents and/or large conversion voltage differentials. As with most things, however, the switch-mode converter's list of advantages has a corresponding list of disadvantages. Potential disadvantages include poor transient response, possible operational instability, significant radiated and conducted electromagnetic interference (EMI), and the need for high performance components, e.g., inductors with good core saturation properties and low dc losses, low equivalent series resistance (ESR) capacitors, etc.

Careful printed circuit board (PCB) layout, such as by minimizing switched current loop areas and using appropriate grounding layouts, and careful component selection, together go a long way toward addressing many of the potential disadvantages associated with switch-mode converters. More fundamentally, however, some converter topologies offer intrinsically superior performance, although it should be understood that a particular converter topology's "superiority" might apply only in the context of particular applications or uses.

The "Ćuk converter" represents one such converter topology that offers superior switch-mode performance for an appreciable variety of applications. Developed by Dr. Slobodon Ćuk, and described in exemplary fashion in U.S. Pat. No. 4,184,197 (now expired), the "Ćuk topology" offers particular advantages with regard to EMI in that neither its input nor its output currents are truly "switched" on and off. Many other converter topologies electrically switch (connect/disconnect) one or both the input and output converter circuits, resulting in pulsed input or output currents, or both. For example, so-called "boost" and "buck-boost" converters have at least one side (input or output) with pulsed current. Pulsed input/output current increases the risk of EMI problems, among other things.

With the Ćuk topology, an input inductor circuit is coupled to an output inductor circuit through a storage element, which typically is implemented as a charge storage capacitor. The opposing sides of that capacitor are alternately switched to reference ground, such that the desired output voltage is generated as a function of charge transfer through the switched capacitor. With the series placement of the input and output inductors, the input and output currents are naturally "smoothed" rather than pulsed, which yields greatly reduced EMI.

Because the Ćuk topology is naturally inverting, although that behavior may be altered through modified capacitor switching, it stands as a natural candidate for use in environments with readily available negative voltage supplies, such as the −48 VDC "rail" commonly used in telecommunication circuits, e.g., in Central Office systems, and in wireless communication base stations. However, in many such circumstances, such as where the negative rail otherwise might be "tapped" for use in high-power radio frequency transmit signal generation, the performance of the general Ćuk topology falls short in terms of bandwidth, as well as in other areas.

Ideally, then, one would modify the general Ćuk topology to extend its performance in the context of telecommunication usage. With the required improvements, an appropriately modified Ćuk converter would offer an advantageous means for using the reliable and ubiquitous negative supply rail(s) available in telecommunication and wireless network systems directly in transmit signal generation, or for other demanding, relatively high-bandwidth voltage conversion tasks.

SUMMARY OF THE INVENTION

The present invention comprises a method and apparatus to extend the operation of an inverting Ćuk converter by applying closed-loop hysteretic control. Using such hysteretic control expands the range of advantages of the general Ćuk converter topology to include significantly enhanced line and load regulation performance. That is, hysteretic feedback control is used to extend the control bandwidth of the Ćuk converter topology in a dc voltage converter, enabling such converters to serve in dc-to-RF modulation applications and other radio amplifier applications, microprocessor supply controller applications and other higher-performance dc-to-dc voltage conversion applications.

In an exemplary embodiment, a dc voltage converter includes a hysteretically controlled Ćuk converter circuit and an optional damping control circuit to ensure stability of operation over the extended converter bandwidth. Advantageously, the damping control circuit may be implemented at low component cost as a resistor-capacitor "snubber" circuit coupled across the energy transfer capacitor used to couple input and output inductive circuits that form part of the basic Ćuk converter topology. Where the inventive converter is used in RF signal amplification, the damping circuit may be tuned for sub-harmonics of the RF signal.

Further, the feedback control loop of the converter may include, in addition to a hysteretic controller, a pulse controller that limits the maximum on/off pulse time. With inclusion of such pulse limiting, a transformer drive circuit may be used without the potential core saturation problems that might otherwise arise. Use of the transformer drive circuit may be particularly desirable where the input voltage to the converter has a fairly high magnitude, and thus would complicate the design of non-isolated drive circuits. One example of such circumstances is usage of the converter as a supply signal modulator for a power amplifier in a "polar modulation" radio transmitter circuit within a wireless communication base station. In such applications, the switching rate of the inventive converter may be configured based on known RF signal characteristics, such as the information symbol or chip rate of the signal.

Wireless base stations typically provide a high-reliability negative supply rail at −48 VDC or some other standard voltage, as do many other types of telecommunication equipment. A supply signal modulator for a polar modulation transmitter thus might comprise a linear amplifier in combination with a dc voltage converter configured according to the present invention. The linear amplifier advantageously would have a relatively high bandwidth and supply the higher frequency but lower power components of the modulated supply signal, while the converter of the present invention would supply the lower frequency but higher power components of that signal. With that configuration, much of the power for supply signal modulation would be taken directly from the highly reliable −48 VDC rail, thus simplifying the circuit design.

Most radio base station high power RF amplifier circuits first convert −48 VDC to +28 VDC, but the present invention eliminates the need for that step. That is, RF signal power may be taken directly and efficiently" from the −48 VDC rail using the dc voltage converter of the present invention.

Of course, those skilled in the art will appreciate that the present converter's extended bandwidth, stability of control, and convenient transformer drive capability make it an exemplary candidate for use in a wide range of applications. As such, it should be understood that the present invention is not limited by the following exemplary details.

DETAILED DESCRIPTION OF THE INVENTION

Figure 1:
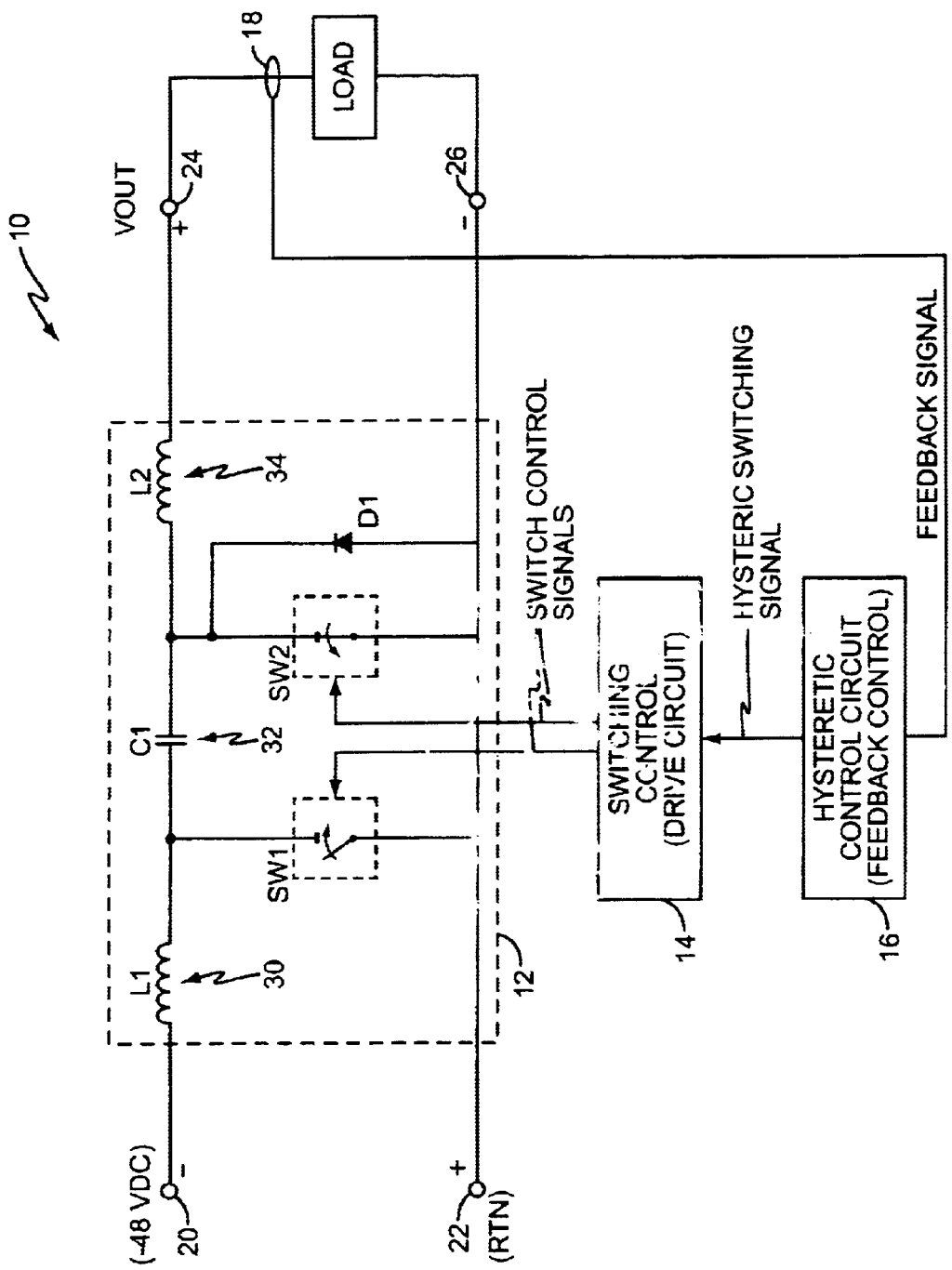
FIG. 1 is a diagram of an exemplary embodiment of a dc voltage converter according to the present invention.

FIG. 1 illustrates an exemplary inverting dc voltage converter 10 according to the present invention. In this embodiment, converter 10 comprises an inverting Cuk converter circuit 12, a switching control circuit (drive circuit) 14, a hysteretic feedback controller 16, and a feedback sensing circuit 18.

As shown, converter 10 provides input terminals 20 and 22, and output terminals 24 and 26. The "sense" of input-to-output voltage naturally is inverted with the illustrated configuration, thus a negative input voltage applied to terminals 20 and 22 is converted to a positive voltage of a desired magnitude and output on terminals 24 and 26 for powering an attached load. The inverting Cuk converter circuit 12 provides such voltage inversion and, in this exemplary embodiment, comprises an input inductor circuit 30, including inductor L1, which is coupled through a switched capacitor circuit 32 to an output inductor circuit 34, including inductor L2.

In basic operation, assume that switch SW1 of circuit 32 is open and switch SW2 is closed, thus allowing capacitor C1 of circuit 32 to charge up to the negative input voltage applied across terminals 20 and 22, with charging current flowing through SW2, C1, and L1 (note that during such charging D1 holds the voltage across SW2 to within a diode drop of reference ground (RTN)). If SW1 is then closed in conjunction with opening SW2, the output side of capacitor C1 is forced to a positive voltage according to the familiar capacitor current equation, $$I_C = C\frac{dv}{dt},$$

which illustrates that the voltage across a capacitor cannot change instantaneously. With this second switch configuration, capacitor C1 discharges into the output load based on the current path through SW1, C1, L2, and the load. With repeated switching cycles, a positive output voltage is maintained at the load.

With the present invention, hysteretic control circuit 16 controls, directly or indirectly, such switching of the inverting Cuk converter circuit 12. Incorporating such hysteretic feedback control extends the range of applications to which the basic Cuk converter topology may be applied by increasing the converter's feedback control bandwidth. Here, feedback sensor circuit 18 may be a direct connection from the output supply terminal 24 to provide the feedback signal as direct voltage feedback to the hysteretic controller's feedback signal input, or it may be a current sensor to generate the feedback signal as a function of load current. In any case, the feedback signal may be buffered and/or scaled as needed or desired by feedback sensor circuit 18.

With exemplary hysteretic control, the feedback signal is compared to upper and lower reference levels, which generally Hie above and below a reference signal level, e.g., a reference voltage level at the desired output voltage level, or proportional to the desired output voltage. If the feedback signal falls below the lower reference level, the hysteretic switching signal generated by hysteretic control circuit 16 is "asserted" (e.g., pulsed high), which turns "on" the converter circuit 12, i.e., discharges capacitor C1 into the output load. Such action causes the output voltage to rise and thus causes the feedback signal to rise.

Once the feedback signal rises above the upper reference level, the hysteretic controller circuit 16 de-asserts its output signal, which turns the converter circuit "off." Of course, those skilled in the art will recognize that negative logic (low assertion) may be used and the statements about high and low assertions should thus be understood as representing nothing more than exemplary logic levels for the illustrated circuit. The loop area of the hysteretic control can be tailored to the desired switching response of the RF modulation in CDMA2000, WCDMA, OFDM, or GSM/EDGE signals. For example, the hysteresis loop can be adjusted to cause the switching rate to be either faster or slower than the symbol rate in GSM/EDGE.

Figure 2:
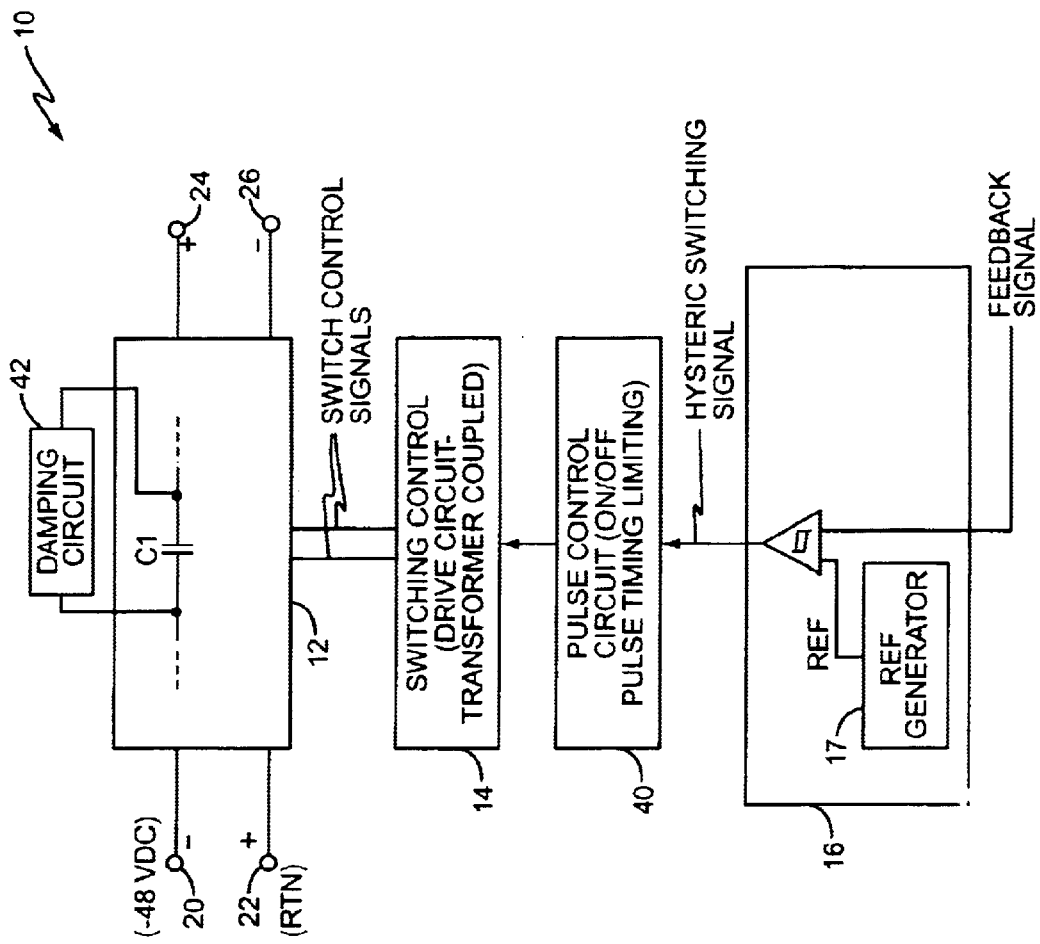
FIG. 2 is a diagram of another exemplary embodiment of a dc voltage converter.

FIG. 2 illustrates another exemplary embodiment of a dc voltage converter 10 according to the present invention. Here, the dc voltage converter 10 further includes a pulse control circuit 40 and a damping circuit 42. Further, the exemplary hysteretic switching controller 16 includes a high-speed comparator having a first input coupled to the feedback sensing circuit 18, and a second input coupled to a reference signal that corresponds to a desired output voltage level, and thus provides a reference for setting the hysteretic switching levels.

Note, too, that the hysteretic controller 16 may include, or otherwise may be associated with, a reference generator 17 that provides the reference signal for input to the hysteretic controller's comparator. The reference generator 17 may comprise one or more voltage references, such as one or more resistive voltage dividers, band-gap references, etc.

Indeed, reference generator 17 may be adjustable, or otherwise programmable, such that the reference signal can be adjusted as needed or desired.

The pulse control circuit 40 provides on and off time pulse width limiting for the hysteretic switching signal, such that the switching control circuit 14, hereinafter "drive circuit 14," may be configured as a transformer-coupled drive circuit. That is, transformer coupling of the switching control signals is desirable because of the voltage levels involved but the use of transformer coupling is not appropriate where the input drive signals may drive the transformer into saturation.

By using pulse-time limiting, then, the converter 10 according to the present invention ensures that the input drive signals to drive circuit 14 are limited to maximum on and off times, even if the hysteretic switching signal exceeds a 50% duty cycle. Note that such pulse-time control obviates the need for so-called "pulse skipping," wherein drive pulses are suppressed rather than time-limited to avoid transformer saturation.

Figure 3:
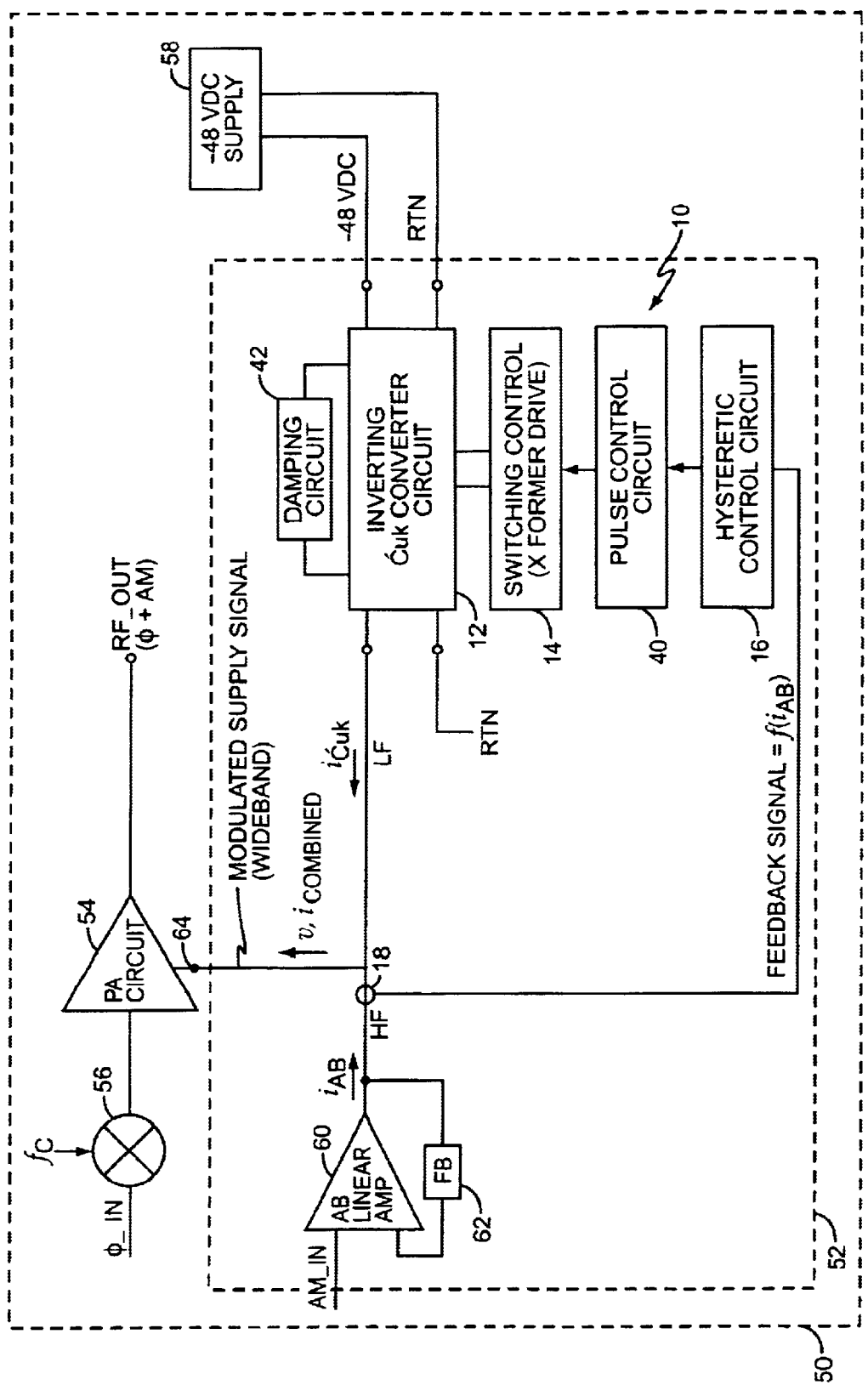
FIG. 3 is a diagram of an exemplary radio frequency amplifier according to the present invention, which includes the dc voltage converter of FIG. 2, for example.

Providing further robustness, damping circuit 42 provides damping for a desired signal frequency range, which may be particularly useful in applications where the extended control bandwidth of converter 10 is used to advantage in radio frequency amplification applications, or where high-frequency load transients occur. FIG. 3 illustrates an exemplary amplifier application, wherein the converter 10 resides within a wireless communication base station 50 that includes a polar modulation transmitter circuit 52. In this embodiment, the output signal of converter 10 is responsive to an RF modulation signal and converter 10 thus operates as a dc-to-RF modulation circuit having a variable frequency and variable pulse width switching characteristics as a result of hysteretically tracking the RF modulation signal, AM_IN.

Polar modulation transmitters, sometimes referred to as "VDD amplifiers," "supply modulators," "envelope tracking" or "Kahn" technique transmitters, split phase and amplitude information into separate signal paths so that a constant-envelope phase-modulated signal may be amplified by a saturated-mode power amplifier (PA). The supply signal, e.g., the input supply voltage, to the PA is modulated in accordance with desired amplitude modulation information such that the output signal from the PA includes both phase and amplitude modulation. Substantial information regarding exemplary polar modulation transmitters and corresponding VDD amplifiers may be found in the earlier incorporated application and U.S. patent, from which the instant application claims priority, and which are incorporated by reference herein.

In the illustrated polar modulation transmit amplifier 52, a power amplifier 54 receives a constant-envelope phase-modulated signal as its input from a phase modulator 56, that phase modulates a carrier frequency signal according to an input phase modulation information signal ($\phi$_IN). In amplifier circuit 52, converter 10 uses power from the negative voltage supply 58 and operates in combination with a linear amplifier circuit 60, including feedback circuit 62, to provide a modulated supply signal at a modulated supply signal output node 64. Supply 58 advantageously is the −48 VDC supply rail available in base station 50.

The feedback signal circuit 18 operates as a current sensor, and thus provides a feedback control signal to the hysteretic control circuit 16 as a function of the output current from the linear AB-class amplifier 60, which preferably is a relatively wideband amplifier. Because that current varies responsive to the output signal from converter 10, the feedback control signal is responsive to the RF modulation signal input to linear amplifier 60. With this arrangement, linear amplifier 60 supplies the higher frequency signal components in the modulated supply signal, i.e., the combined output signal from the amplifier circuit 52, while converter 10 supplies the lower frequency signal components in the modulated supply signal.

Such operation is advantageous because the linear, wideband amplifier 60 amplifies the higher frequency but lower power components in the input amplitude modulation information signal (AM_IN), and the more efficient converter 10 amplifies the lower frequency but higher power components in the AM_IN signal. With this approach, the exemplary amplifier circuit 52 offers good efficiency without loss of bandwidth. That is, converter 10 provides most of the modulated signal power from dc to some upper RF frequency, e.g., 1 MHz or greater, while the less efficient linear amplifier 60 provides the majority of modulated signal power for the higher frequency components of the modulated supply signal. Notably, the inherent efficiency of this arrangement is enhanced further inasmuch as the negative supply voltage is converted into a positive voltage modulated RF output signal by converter 10 without first having to convert it to a positive dc voltage.

Figure 4:
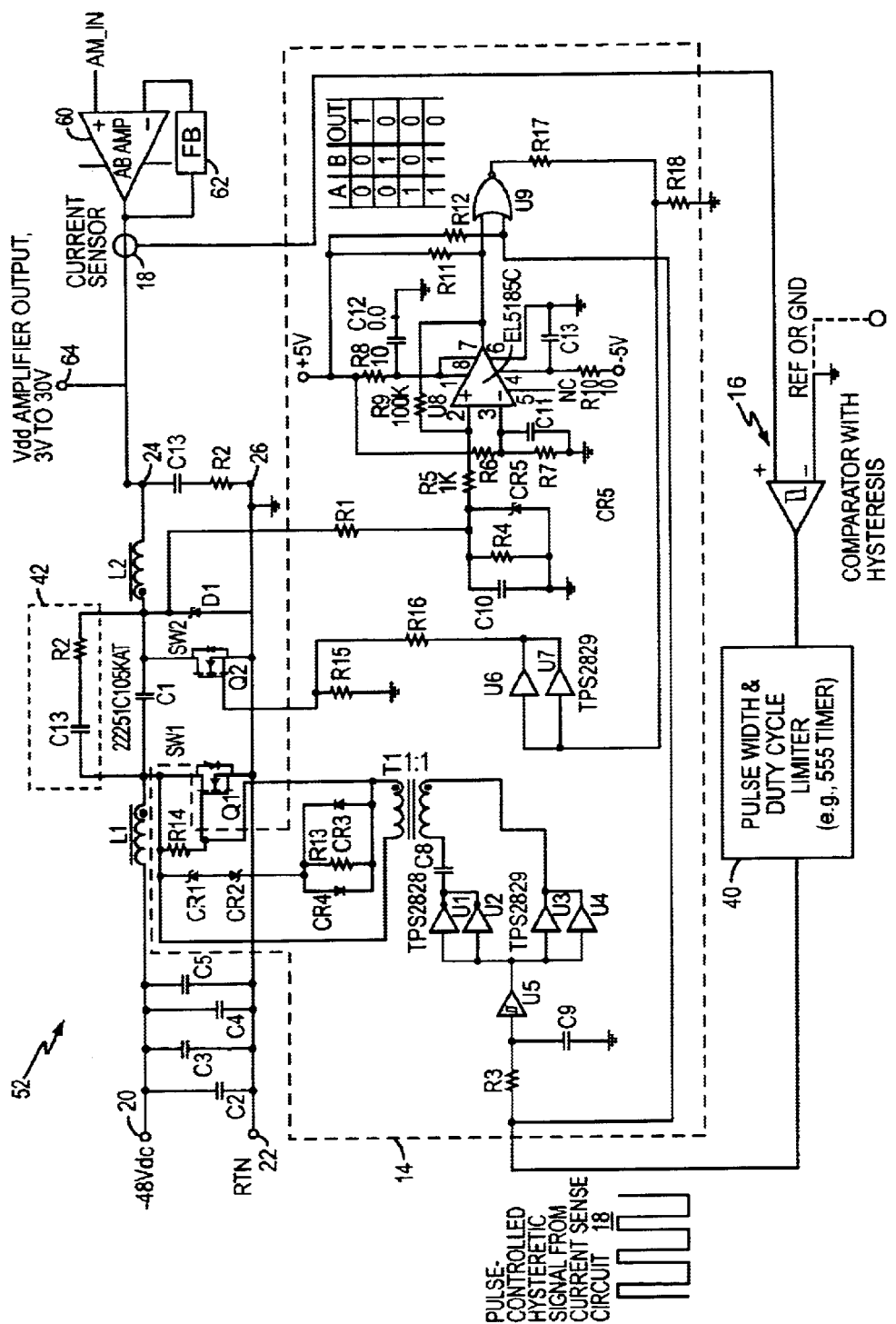
FIG. 4 is a diagram of exemplary schematic details for the converter of FIG. 2.

FIG. 4 depicts amplifier circuit 52 according to exemplary circuit details. It should be understood that where specific component values and/or component models are illustrated, such details represent exemplary and not limiting design choices. Exemplary details regarding damping circuit 42 include the use of a series RC snubber circuit having a frequency response tuned to dampen sub-harmonics of the RF frequency of the AM_IN signal to avoid undesirable oscillations of the converter 10. Properly tunned, the RC snubber circuit prevents sub-harmonic oscillation, and dissipates an insignificant amount of power. Of course, the frequency response of damping circuit 42 generally is set in dependence on the frequency range at which the overall feedback control loop experiences critical phase margin, which changes with design details.

In further illustration of exemplary details, the drive circuit 14 includes transformer T1, which has an exemplary primary-to-secondary turn ratio of 1:1. Note, too, the use of hysteretic buffer circuit U5 to drive the inverting gates U1 and U2 and the non-inverting gates U3 and U4, which collectively drive transformer T1 responsive to the pulse-width limited hysteretic switching signal. The use of such an arrangement provides good noise immunity and reliable transformer winding drive. On that point, the use of capacitor C8 in series with the transformer winding serves as a dc-blocking capacitor to prevent dc current from flowing from U1/U2 to U3/U4, or vice versa.

FIG. 4 further illustrates exemplary control logic for the drive circuit 14, in which the switching control signals generated by it for switches SW1 and SW2 of the Ćuk converter circuit 12, shown here as Field Effect Transistors (FETS) Q1 and Q2, is based on comparing a feedback voltage taken from the output side of energy transfer capacitor C1 to a reference voltage, which is formed using the R5/R6 voltage divider on input terminal (3) of U8.

The state of the pulse-limited hysteretic switching signal output from pulse control circuit 40 in combination with the relative magnitudes of the voltages in input terminals (2) and (3) of U8, determine the logic input combination to NOR gate U9. Using the nomenclature of "A" and A "B" to represent the NOR gates inputs, A is high if the voltage taken from energy transfer capacitor C1 of converter 12 exceeds a reference voltage formed by voltage divider R5/R6. Signal B simply is the pulse-limited hysteretic switching signal output from pulse control circuit 40.

As mentioned earlier, when converter 10 is configured as a dc-to-RF modulator such as in the context of amplifier 52, its operation may be tuned, or otherwise adjusted in respect of the desired operating frequencies. For example, as noted, the damping circuit 42 may be configured to have a frequency response that dampens subharmonics of RF signals of interest. More generally, the operating frequency, e.g., the switching rate, of converter 10 may be set or adjusted as a function of known signal characteristics, such as the symbol or chip rate of a particular signal modulation format.

For example, where amplifier 52 is used as a polar modulation transmitter in a wireless communication base station transmitter, one or more signal modulation formats may be of particular interest, e.g., CDMA2000, WCDMA, or GSM/EDGE modulation formats, and the switching rate of converter 10 may be adjusted as a function of the information symbol rate or chipping rate of the particular modulation format. Mechanisms for adjusting the switching rate include, but are not limited to, adjusting one or more reactive elements, such as the output inductor L2, adjusting the hysteretic controller's reference signal level, adjusting the hysteretic controller's hysteretic range, etc.

Any or all such parameters may be fixed for a desired modulation format, or may be adjustable for different modulation formats, such as might be desirable for a multi-mode transmitter intended for use with different modulation formats, such as a combined WCDMA and GSM/EDGE transmitter. Regardless, the average switching rate of converter 10 may be set based on the modulation symbol or chipping rate of the RF signal of interest. Further, that switching rate may be changed as a function of selecting another modulation format, such as might be done in a multi-mode (multi-format) transmitter.

Nominally, converter 10 would be configured, by properly setting the hysteretic controller's reference signal level for example, such that the current from linear amplifier 60 is zero. However, in practical terms, linear amplifier 60 supplies at least some of the supply current into power amplifier 56 because of its higher bandwidth as compared to converter 10. Thus, amplifier 60 and converter 10 cooperatively work to generate the modulated supply signal based on their combined output signals.

This cooperative interaction influences the configured switching rate of converter 10. For example, the switching rate of converter 10 ideally is set much higher than the Nyquist frequency of the RF signal's symbol or chip rate, e.g., 10 times higher. However, limitations on practical switching rates may prevent setting the switching rates that high.

In those instances, it may be preferable to set the converter's switching rate below the symbol or chip rate of the RF signal. In any case, the switching rate preferably is set to balance contributions of converter 10 with contributions of the linear amplifier 60 such that their combined signals form a low-distortion modulated supply signal.

Figure 5:
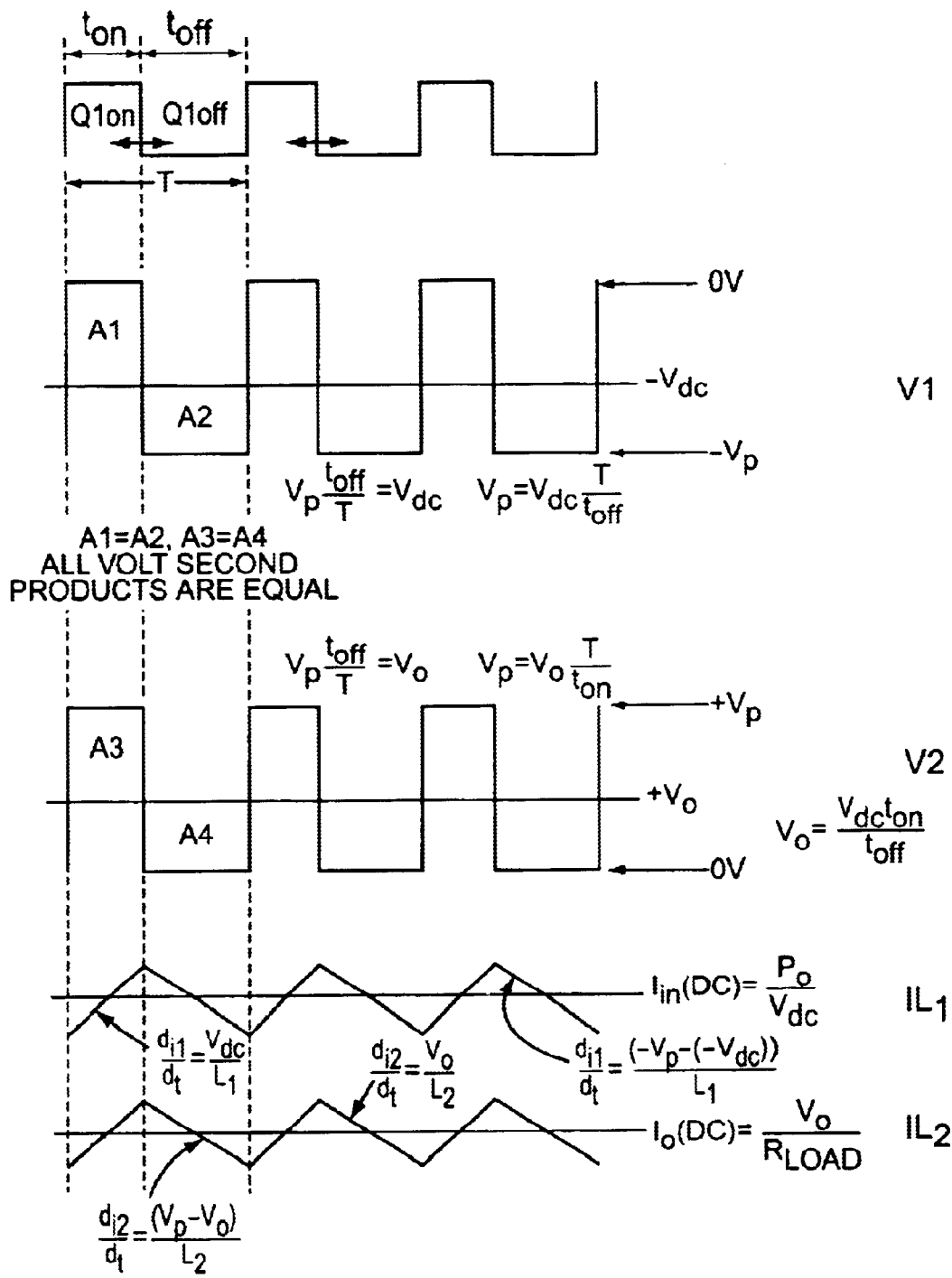
FIG. 5 is a diagram of exemplary converter voltage and current waveforms.
Figure 6A:
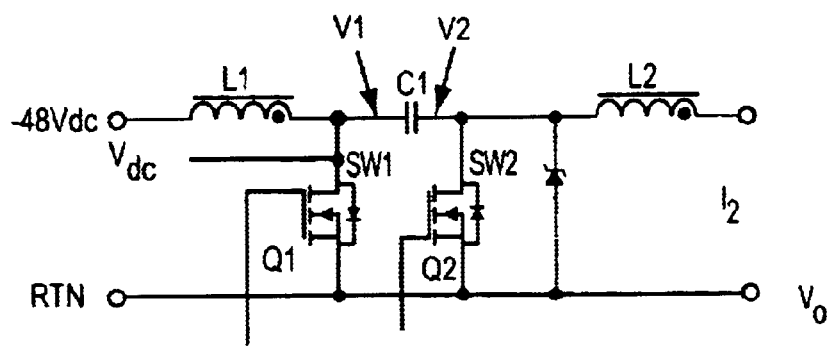
FIGS. 6A–6D are diagrams of exemplary converter switching current flows.
Figure 6B:
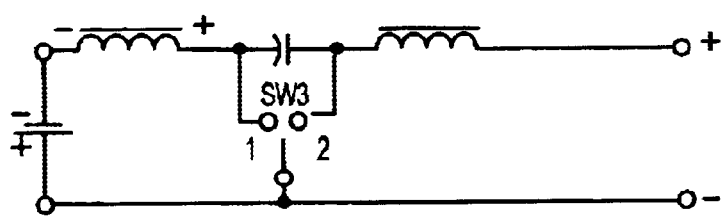
Figure 6C:
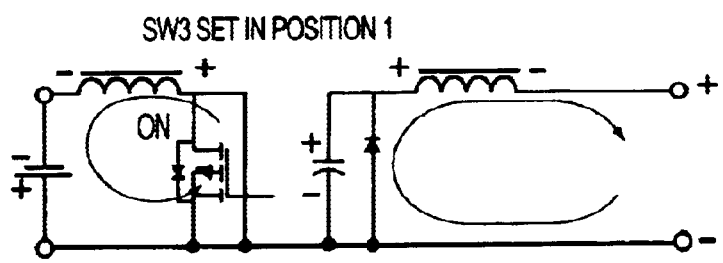
Figure 6D:
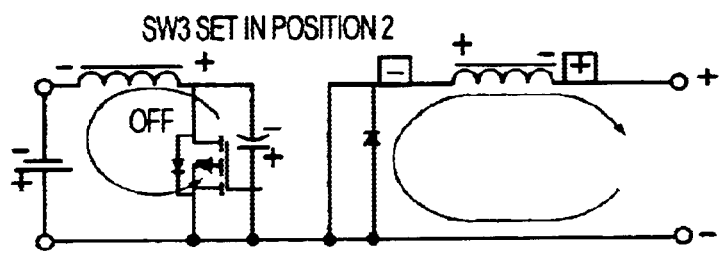

FIGS. 5 and 6A–6D illustrate exemplary switching details for converter 10. In particular, FIG. 5 illustrates exemplary voltage and current waveforms for the voltages and currents within the Ćuk converter circuit portion of converter 10. In reviewing these exemplary diagrams, note that in FIG. 6A, the SW1/SW2 pair is, for ease of visualization, symbolized as a single-pole-double-throw switch SW3, that may be "flipped" from input to output sides of C1. FIGS. 6B–6C illustrate the charging and discharging currents discussed earlier herein for the two positions of SW3.

While such details aid understanding exemplary operations of converter 10, those skilled in the art should not construe them as limiting. Indeed, the use of converter 10 in RF amplifier circuit 52 illustrates an exemplary application, but it should not be understood as limiting the range of applications to which the inventive converter 10 might be applied. As noted, the incorporation of hysteretic feedback control into the basic Ćuk converter topology yields significant performance improvements with regard to converter frequency response and, as such, converter 10 of the present invention finds use in a variety of applications, including, but not limited to, microprocessor power supplies, portable electronic device power supplies, etc. As such, the present invention is not limited by the foregoing details but rather is limited only by the scope of the following claims and their reasonable equivalents.

What is claimed is:

1. A dc voltage converter comprising:
   an inverting Ćuk converter circuit to generate an output signal by inverting a negative input voltage signal; and
   a hysteretic control circuit to control switching of the Ćuk converter circuit based on comparing a feedback control signal with a reference signal, so that an output signal level of the Ćuk converter circuit is maintained under hysteretic feedback control, said feedback control signal being derived from the output signal.

2. The dc voltage converter of claim 1, wherein the output signal is responsive to a radio frequency (RF) modulation signal such that the dc voltage converter is configured as a dc-to-RF modulator generating the output signal as a RF output signal using power obtained from the negative input voltage signal.

3. The dc voltage converter of claim 1, wherein a switching rate of the dc voltage converter is configured according to a known signal characteristic of the RF modulation signal.

4. The dc voltage converter of claim 3, wherein the known signal characteristic of the RF modulation signal is a symbol or chip timing of the RF modulation signal.

5. The dc voltage converter of claim 4, wherein the switching rate is configured according to signal characteristics for one of CDMA2000, WCDMA, OFDM, or GSM/EDGE RF envelope waveforms.

6. The dc voltage converter of claim 1, further comprising a transformer-coupled drive circuit to generate a switching signal for switching the Ćuk converter circuit responsive to the hysteretic control circuit.

7. The dc voltage converter of claim 6, further comprising a pulse timing circuit to limit on-times and off-times of a pulsed control signal generated by the hysteretic control circuit for input to the transformer-coupled drive circuit, such that the dc voltage converter operates as a duty-cycle limited controller.

8. The dc voltage converter of claim 1, wherein the pulse timing circuit substantially maintains operation of the converter at less than a fifty-percent duty cycle to prevent saturation of the transformer-coupled drive circuit.

9. The dc voltage converter of claim 8, wherein the pulse timing circuit includes one or more timing circuits and one more corresponding pulse width limiting circuits to control minimum off and maximum on times of signal pulses in the pulsed control signal to substantially maintain converter operation below a fifty-percent duty cycle without pulse skipping.

10. The dc voltage converter of claim 1, further comprising a damping circuit coupled across an energy transfer capacitor of the Ćuk converter circuit to reduce oscillation in a converter output signal provided by the output inductor circuit.

11. The dc voltage converter of claim 10, wherein the damping circuit comprises a resistor-capacitor series snubber circuit.

12. The dc voltage converter of claim 1, wherein the hysteretic control circuit comprises a voltage comparator that includes a first comparator input coupled to the feedback control signal, a second comparator input coupled to at least one reference signal, and a comparator output to provide a pulsed control signal that drives switching of the Ćuk converter circuit.

13. The dc voltage converter of claim 1, wherein the dc voltage converter comprises
- a part of a radio frequency amplifier circuit comprising:
  - a wideband linear amplifier to generate a second output signal responsive to a radio frequency input signal;
  - a current sensor circuit to generate the feedback control signal as a function of current in the second output signal; and
  - a connecting node to provide a combined output signal as a combination of the output signal of the dc voltage converter and the second output signal of the wideband linear amplifier;
  - said wideband linear amplifier supplying higher frequency components in the combined output signal, and said dc voltage converter operating as a dc-to-RF modulator and supplying lower frequency to dc components in the combined output signal.

14. The dc voltage converter of claim 13, wherein the radio frequency amplifier comprises a supply modulation amplifier used in a polar modulation radio transmitter within a radio base station, and wherein a negative dc voltage supply rail of the radio base station is coupled to the inverting Ćuk converter as the negative input voltage signal.

15. A polar modulation transmitter including the dc voltage converter of claim 1, and further comprising:
- a power amplifier to generate a radio frequency (RF) transmit signal as a function of a phase-modulated input signal and an amplitude-modulated supply signal;
- a linear amplifier circuit to generate higher frequency components of the amplitude-modulated supply signal; and
- a current sensor to generate the feedback control signal for the dc voltage converter by sensing output current from the linear amplifier circuit;
- said dc voltage converter to generate lower frequency components of the amplitude-modulated supply signal responsive to the feedback control signal.

16. A method of generating a radio frequency (RF) transmit signal by polar modulation using the dc voltage converter of claim 1, the method comprising:
- inputting a constant-envelope, phase-modulated signal to a power amplifier circuit;
- generating an amplitude modulated supply signal to power the power amplifier circuit by combining a second output signal with the output signal from the dc converter circuit;
- generating the second output signal by amplifying an amplitude-modulated signal via a wideband linear amplifier; and
- generating the feedback control signal for the dc voltage converter based on sensing current from the linear amplifier such that the output signal of the dc converter circuit is responsive to the sensed current from the wideband linear amplifier.

17. The method of claim 16, further comprising powering the dc voltage converter circuit from a negative supply rail in a radio base station such that a majority of the power in the amplitude modulated supply signal is obtained directly from the negative supply rail via the dc voltage converter circuit.

* * * * *

UNITED STATES PATENT AND TRADEMARK OFFICE
CERTIFICATE OF CORRECTION

PATENT NO. : 6,710,646 B1
APPLICATION NO. : 10/404388
DATED : March 23, 2004
INVENTOR(S) : Kimball Page 1 of 1

It is certified that error appears in the above-identified patent and that said Letters Patent is hereby corrected as shown below:

On the Title Page, item (63), under "Related U.S. Application Data", in Column 1, Line 3, delete "Sep. 5" and insert -- May 5 --, therefor.

In FIG. 1, Sheet 1 of 6, Below Box 14, Line 1, delete "HYSTERIC" and insert -- HYSTERETIC --, therefor.

In FIG. 2, Sheet 2 of 6, Below Box 40, Line 1, delete "HYSTERIC" and insert -- HYSTERETIC --, therefor.

In Column 4, Line 30, delete "Hie" and insert -- lie --, therefor.

In Column 6, Line 33, delete "tunned" and insert -- tuned --, therefor.

In Column 6, Line 56, delete "(FETS)" and insert -- (FETs) --, therefor.

In Column 6, Line 64, after "and" delete "A".

In Column 9, Lines 12-13, in Claim 13, delete "comprises            a part" and insert -- comprises a part of --, therefor.

Signed and Sealed this

Fifteenth Day of April, 2008

JON W. DUDAS
*Director of the United States Patent and Trademark Office*